United States Patent
Roig-Guitart et al.

(10) Patent No.: US 9,413,348 B2
(45) Date of Patent: Aug. 9, 2016

(54) ELECTRONIC CIRCUIT INCLUDING A SWITCH HAVING AN ASSOCIATED BREAKDOWN VOLTAGE AND A METHOD OF USING THE SAME

(71) Applicant: Semiconductor Components Industries, LLC, Phoenix, AZ (US)

(72) Inventors: Jaume Roig-Guitart, Oudenaarde (BE); Filip Bauwens, Ghent (BE); Chin Foong Tong, Singapore (SG)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 14/576,604

(22) Filed: Dec. 19, 2014

(65) Prior Publication Data

US 2016/0036431 A1    Feb. 4, 2016

Related U.S. Application Data

(60) Provisional application No. 62/030,246, filed on Jul. 29, 2014.

(51) Int. Cl.
| | |
|---|---|
| *H01L 29/74* | (2006.01) |
| *H03K 17/10* | (2006.01) |
| *H02M 3/158* | (2006.01) |
| *H02M 1/32* | (2007.01) |

(52) U.S. Cl.
CPC ............. *H03K 17/102* (2013.01); *H02M 3/158* (2013.01); *H02M 1/32* (2013.01)

(58) Field of Classification Search
CPC ..... H01L 22/34; H01L 27/1443; H01L 29/74; H01L 32/07; H03F 3/211
USPC .......................................................... 257/76
See application file for complete search history.

(56) References Cited

U.S. PATENT DOCUMENTS

| | | |
|---|---|---|
| 3,890,630 A | 6/1975 | Huang |
| 4,799,100 A | 1/1989 | Blanchard et al. |
| 5,536,958 A | 7/1996 | Shen et al. |
| 5,550,701 A | 8/1996 | Nadd et al. |

(Continued)

OTHER PUBLICATIONS

Zeineddine et al., "A Power-Efficient Method to Mitigate the EMI of Switched-Mode Power Supplies", 8th International Conference on Power Electronics—ECCE Asia, May 30-Jun. 3, 2011, pp. 453-459.

(Continued)

*Primary Examiner* — Michael Lebentritt
(74) *Attorney, Agent, or Firm* — Abel Law Group, LLP

(57) ABSTRACT

An electronic device can include a switch coupled to a switching node. In an embodiment, the switch has a breakdown voltage is less than 2.0 times the designed operating voltage. In another embodiment, the electronic device can further include another switch, wherein both switches are coupled to each other at a switching node. The switches can have different breakdown voltages. In a particular embodiment, either or both switches can include a field-effect transistor and a zener diode that are connected in parallel. The zener diode can be designed to breakdown at a relatively lower fraction of the designed operating voltage as compared to a conventional device. Embodiments can be used to reduce voltage overshoot and ringing at the switching node that may occur after changing the states of the first and second switches. Processes of forming the electronic device can be implemented without significant complexity.

20 Claims, 5 Drawing Sheets

(56) References Cited

U.S. PATENT DOCUMENTS

| | | | |
|---|---|---|---|
| 5,568,044 A * | 10/1996 | Bittner | H02M 3/156 323/224 |
| 5,815,353 A * | 9/1998 | Schwenkel | G01R 31/1236 361/111 |
| 5,945,868 A | 8/1999 | Robb et al. | |
| 6,204,648 B1 | 3/2001 | Saeki et al. | |
| 7,122,860 B2 | 10/2006 | Peake et al. | |
| 7,195,979 B2 | 3/2007 | Elbanhawy | |
| 7,288,970 B2 * | 10/2007 | Bertin | B82Y 10/00 326/112 |
| 7,368,934 B2 | 5/2008 | Ciuffoli | |
| 7,495,877 B2 | 2/2009 | Havanur | |
| 7,800,176 B2 | 9/2010 | Werner | |
| 8,034,685 B1 | 10/2011 | Venkatraman et al. | |
| 8,232,610 B2 | 7/2012 | Nakazawa et al. | |
| 8,389,354 B2 | 3/2013 | Hshieh | |
| 8,389,369 B2 | 3/2013 | Loechelt | |
| 2006/0249747 A1 * | 11/2006 | Shushakov | H01L 27/1443 257/122 |
| 2007/0109822 A1 * | 5/2007 | Kuan | H02M 3/1588 363/21.14 |
| 2007/0138544 A1 | 6/2007 | Hirler et al. | |
| 2008/0017920 A1 | 1/2008 | Sapp et al. | |
| 2008/0179670 A1 | 7/2008 | Willmeroth et al. | |
| 2009/0166720 A1 | 7/2009 | Zundel | |
| 2010/0163950 A1 | 7/2010 | Gladish et al. | |
| 2011/0103100 A1 * | 5/2011 | Hosotani | H01F 3/10 363/21.02 |
| 2012/0220245 A1 * | 8/2012 | Gossmann | H04B 1/006 455/95 |
| 2013/0038304 A1 | 2/2013 | Roig Guitart et al. | |
| 2013/0336011 A1 * | 12/2013 | Broussev | H02M 3/1588 363/16 |
| 2014/0063593 A1 * | 3/2014 | Berendt | H01S 5/0428 359/341.1 |
| 2014/0097863 A1 * | 4/2014 | Zundel | H01L 22/34 324/762.01 |
| 2015/0014698 A1 * | 1/2015 | Briere | H03K 17/107 257/76 |
| 2016/0036326 A1 * | 2/2016 | Sreenivas | H02M 3/158 323/271 |
| 2016/0036431 A1 * | 2/2016 | Roig-Guitart | H03K 17/102 323/271 |
| 2016/0065061 A1 * | 3/2016 | Tsyrganovich | H02M 3/156 323/312 |

OTHER PUBLICATIONS

Yao et al., "Tapped-Inductor Buck Converter for High-Step-Down DC-DC Conversion", IEEE Transactions on Power Electronics, vol. 20, No. 4, Jul. 2005, pp. 775-780.

Xu et al., "The Active-Clamp Couple-Buck Converter—A Novel High Efficiency Voltage Regulator Modules", Center for Power Electronics Systems, 2001 IEEE, pp. 252-257.

"Converter Improvement Using Schottky Rectifier Avalanche Specification", STMicroelectronics Application Note AN2025, 2004, 11 pages.

Kam et al., "EMC Guideline for Synchronous Buck Converter Design", EMC Laboratory, Missouri University of Science and Technology, 2009, pp. 47-52.

Jiang et al. "A High-Speed Deep-Trench Mosfet With a Self-Biased Split Gate", IEEE Transactions on Electron Devices, vol. 57, No. 8, Aug. 2010, pp. 1972-1977.

Hashimoto et al., A System-in-Package (SiP) With Mounted Input Capacitors for Reduced Parasitic Inductances in a Voltage Regulator, IEEE Transactions on Power Electronics, vol. 25, No. 3, Mar. 2010, pp. 731-740.

Lopez, "Prospects of Voltage Regulators for Next Generation Computer Microprocessors", Polytechnic University of Catalunya, Barcelona, 2010, 474 pages.

Testa et al. "A Reliability Model for Power MOSFETs Working in Avalanche Mode Based on an Experimental Temperature Distribution Analysis", IEEE Transactions on Power Electronics, vol. 27, No. 6, 2012, pp. 3093-3100.

* cited by examiner

ELECTRONIC CIRCUIT INCLUDING A SWITCH HAVING AN ASSOCIATED BREAKDOWN VOLTAGE AND A METHOD OF USING THE SAME

CROSS-REFERENCE TO RELATED APPLICATION

This application claims priority under 35 U.S.C. §119(e) to U.S. Provisional Patent Application No. 62/030,246, entitled "Electronic Circuit Including A Switch Having An Associated Breakdown Voltage And A Method Of Using The Same", by Roig-Guitart et al., filed Jul. 29, 2014, which is assigned to the current assignee hereof and incorporated herein by reference in its entirety.

FIELD OF THE DISCLOSURE

The present disclosure relates to electronic circuits and methods of using electronic circuits, and more particularly to, electronic circuits including switches having associated breakdown voltages and methods of using the same.

RELATED ART

Switching circuits are used in many different applications, such as voltage regulators, voltage boosters, and the like. In one configuration, the switching circuit includes a high-side metal-insulator-semiconductor field-effect transistor (MISFET) and a low-side MISFET electrically connected to each other at a switching node. In a particular application, the drain of the high-side MISFET is electrically connected to a $V_{IN}$ terminal at 12 V, the source of the high-side MISFET is electrically connected to the drain of the low-side MISFET, and the source of the low-side MISFET is electrically connected to ground, and the source of the high-side MISFET and the drain of the low-side MISFET are electrically connected to each other at an output node. The gate of the high-side and low-side MISFETs are controlled such that only one of the MISFETs is on at any particular time.

When changing states, the MISFET that is currently on (high-side or low-side MISFET) is turned off, and then the other transistor that is currently off (the other of the high-side or low-side MISFET) is turned on. The switching circuit has an inductor between a switching node of the MISFETs and a load that is being driven by the switching circuit. Switching the states of the MISFETs can cause overshoot or ringing to occur at the switching node.

Conventionally, each of the MISFETs are designed to have a drain-to-source breakdown voltage ($BV_{DSS}$) that is greater than two times greater than the designed operating voltage to prevent the MISFETs from going into avalanche mode during any and all portions of normal operation of the switching circuit. For example, if the designed operating voltage is 12 V, the MISFETs are designed so that $BV_{DSS}$ for each of the MISFETs is greater than 24 V. In some applications, $BV_{DSS}$ will be even higher, such as 2.5 times higher than the designed operating voltage (for example, 30 V) to provide further margin to prevent the MISFETs from going into avalanche mode. The high-side and low-side MISFETs typically have substantially the same $BV_{DSS}$, such as within 0.1 V of one another. Diodes can be used with the MISFETs; however, such diodes have breakdown voltages that are greater than 2.0 times the designed operating voltage and may be almost as high as $BV_{DSS}$ of the MISFET such diode is to protect. Further improvement of switching circuits is desired.

BRIEF DESCRIPTION OF THE DRAWINGS

Embodiments are illustrated by way of example and are not limited in the accompanying figures.

Figure 1:
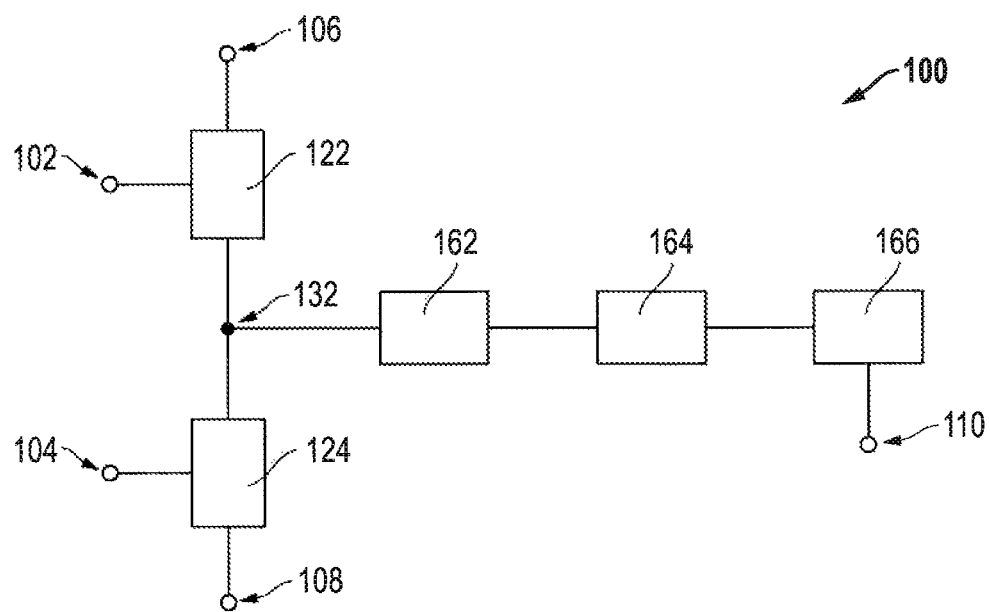
FIG. 1 includes a schematic diagram of a portion of an electronic device having switches in accordance with a particular embodiment.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "designed operating voltage" is intended to mean the nominal voltage over which an electronic device or a portion of the electronic device is designed to operate. For example, a buck converter may be designed to have terminals that are connected to a 12V power supply and ground. Thus, the buck converter has a designed operating voltage of 12 V (12 V–0 V (ground)), even though the actual voltage provided by a 12 V power supply may vary by up to 10% (10.8 V to 13.2 V).

The term "normal operation" and "normal operating state" refer to conditions under which an electronic component or device is designed to operate. The conditions may be obtained from a data sheet or other information regarding voltages, currents, capacitance, resistance, or other electrical parameters. Thus, normal operation does not include operating an electrical component or device well beyond its design limits.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a first switch coupled to a switching node. In an embodiment, the first switch has a breakdown voltage that is less than 2.0 times the designed operating voltage. In another embodiment, the electronic device can further include a second switch that is coupled to the first switch at a switching node. The first and second switches can have different breakdown voltages. In a particular embodiment, the first switch, the second switch, or both can include a field-effect transistor and a zener diode that are connected in parallel. The zener diode can be designed to breakdown at a relatively lower fraction of the designed operating voltage as compared to a conventional device. Embodiments can be used to reduce voltage overshoot and ringing at the switching node that may occur after changing the states of the first and second switches.

The zener diodes can be implemented within structures that are in close proximity to their associated MISFETs. In accordance with a particular embodiment, during avalanche breakdown of the zener diode, electrons do not flow through the channel region of the associated MISFET. Degradation of the channel region (e.g., generation of crystal defects), trapping excess charge within the gate dielectric, or other adverse affect to the MISFET can be substantially reduced or even eliminated. Implementation of the zener diodes can be made by introducing dopant at a proper concentration and depth to allow the zener diode to have the proper avalanche breakdown voltage and improve the likelihood that electrons during avalanche breakdown will generally flow in a desired direction. The concepts as provided herein are better understood reading descriptions of exemplary, non-limiting embodiments as set forth below.

FIG. 1 includes a circuit of a portion of an electronic device 100. In the embodiment as illustrated, the electronic device includes switches 122 and 124. For the switch 122, a current-carrying electrode is coupled to a power supply terminal 106, another current-carrying electrode is coupled to a switching node 132, and a control electrode is coupled to a control terminal 102. For the switch 124, a current-carrying electrode is coupled to a switching node 132, a current-carrying electrode is coupled to a power supply terminal 108, and a control electrode is coupled to a control terminal 104. The electronic device 100 further includes an inductive element 162, a capacitive element 164, and a resistive element 166 that are coupled between the switching node 132 and a power supply terminal 110. Not all of the inductive, capacitive, and resistive elements 162, 164, and 166 are required. Further, the capacitive element 164 may be coupled in parallel with the resistive element 166. In another embodiment, the power supply terminals 108 and 110 may be coupled together. In a particular embodiment, the electronic device 100 can be a buck converter, and may be used in a voltage regulator, a voltage booster, or other suitable application.

Figure 2:
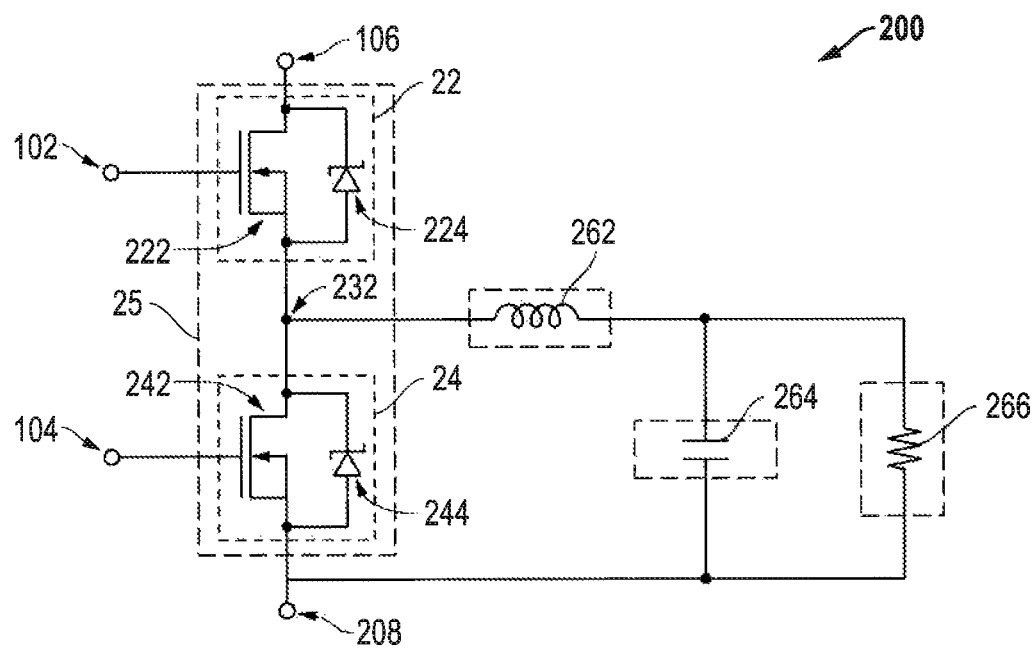
FIG. 2 includes a schematic diagram of a portion of an electronic device having switches in accordance with a particular embodiment.

FIG. 2 includes a circuit of a portion of an electronic device 200 based on the more generic circuit representation in the embodiment as illustrated in FIG. 1. In the embodiment as illustrated, the electronic device 200 includes a high-side switch 22 and a low-side switch 24. The high-side switch 22 includes a high-side MISFET 222 and a high-side zener diode 224. The drain region of the high-side MISFET 222 and the cathode of the zener diode high-side 224 are coupled to the power supply terminal 106, and the source region of the high-side MISFET 222 and the anode of the high-side zener diode 224 are coupled to a switching node 232. The gate electrode of the high-side MISFET 222 is coupled to the control terminal 102. The low-side switch 24 includes a low-side MISFET 242 and a low-side zener diode 244. The drain region of the low-side MISFET 242 and the cathode of the low-side zener diode 244 are coupled to the switching node 232, and the source region of the low-side MISFET 242 and the anode of the low-side zener diode 244 are coupled to a power supply terminal 208. The gate electrode of the low-side MISFET 242 is coupled to the control terminal 104. The switches 22 and 24 may be in different die or may be integrated into a single integrated circuit, designated by the dashed line 25.

The electronic circuit 200 further includes an inductor 262 having one terminal that is coupled to the switching node 232, and another terminal coupled to an electrode of a capacitor 264 and a terminal of a load, which is represented by the resistor 266. The other electrode of the capacitor 264 and the other terminal of the load are coupled to the power supply terminal 208. The dashed lines around the inductor 262, capacitor 264, and the resistor 266 generally correspond to the inductive element 162, the capacitive element 164, and the resistive element 166, respectively, in FIG. 1.

The load may be more complex than the resistor 266 in FIG. 2. For example, the load may have some inductance or capacitance associated with it. The load can be any electronic component that is to be driven by the circuit. Thus, the inductor 262, the capacitor 264, or both may be incorporated into the load. In another embodiment, the inductor 262, the capacitor 264, or both may not be present in the circuit.

All of the couplings as described with respect to FIGS. 1 and 2 may be in the form of electrical connections (for example, the source region of the MISFET 222 and the drain region of the MISFET 242 are electrically connected to each other at the switching node 232) or may have an additional component that does not significantly affect the signal between the various switches and elements as described above.

The operation of the circuit will be described with respect to FIG. 2, however, skilled artisans will understand that the description applies to the circuit in FIG. 1. In a particular embodiment, the power supply terminal 106 can be at $V_{IN}$, which may be 12V, and the power supply terminal 208 can be at 0 V or at ground. The voltage supplied to the load may be 1.2V. Thus, the circuit has a designed operating voltage of 12 V. The switches 22 and 23 will be turned on and off to achieve the proper voltage supplied to the load. Voltage overshoot and ringing can occur at the switching node 232.

In conventional designs, MISFETs and, if present, diodes are designed to have a breakdown voltage that is greater than two times the designed operating voltage. For a designed operating voltage of 12 V, the breakdown voltages of the MISFETs or their associated diodes are greater than 24V, and may be 30 V to provide sufficient margin between the highest overshoot voltage and the breakdown voltages to prevent the MISFETs and diodes from going into breakdown shortly after either of the MISFETs are turned off.

Unlike conventional designs, the zener diodes 224 and 244 are designed to go into avalanche breakdown at a voltage difference between the cathode and anode of less than 2.0 times the designed operating voltage. For the particular example with a 12 V designed operating voltage, the breakdown voltages of the zener diodes 224 and 224 is less than 24 V.

Figure 3:
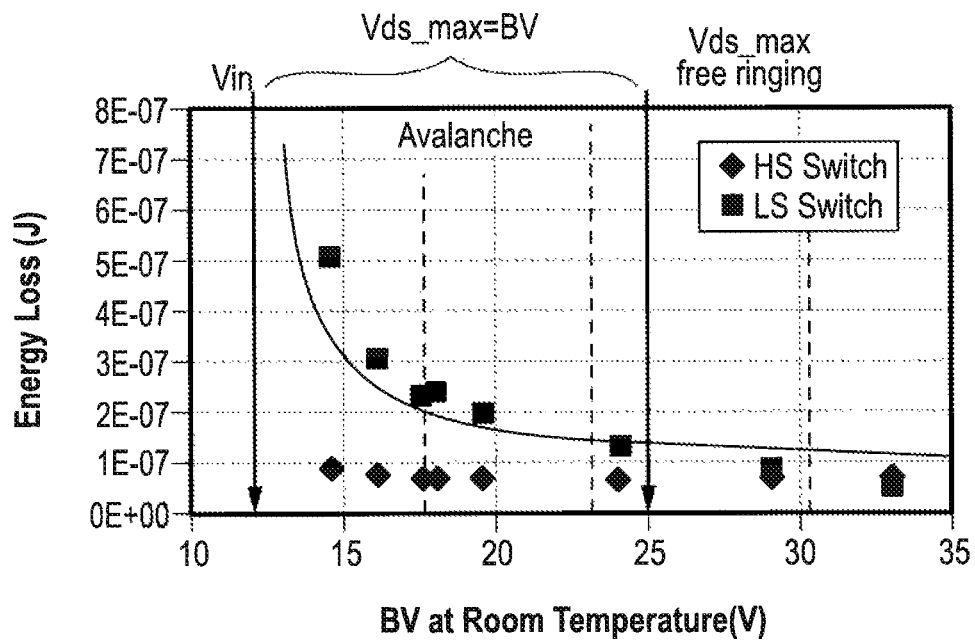
FIG. 3 includes a plot of energy loss as a function of breakdown voltage for a high-side switch and a low-side switch.

FIG. 3 includes a plot of energy as a function of breakdown voltage for the switches 22 and 24 for a designed operating voltage between the power supply terminals 106 and 208 of 12 V. At high breakdown voltages, the energy loss is lower; however, the overshoot and ringing at the switching nodes become unacceptably high. The high-side switch 22 can be taken to a relatively low breakdown voltage without a significant increase of energy loss. The high-side switch 22 can be less than 1.5 times the designed operating voltage or less 1.3 times the designed operating voltage. For a 12 V designed operating voltage, the high-side switch 22 can be less than 18 V or less than 15.6 V. Although not required, the breakdown voltage may be at least 1.1 times the designed operating voltage to account for voltage fluctuations that may occur with power supplies.

The low-side switch 24 has more energy loss as the breakdown voltage decreases. In FIG. 3, the energy loss increases exponentially with a linear decrease in breakdown voltage. The low-side switch 24 can be less than 1.5 times the designed operating voltage. In a non-limiting embodiment, the low-side switch 24 may have a breakdown voltage of at least 1.2 or 1.3 times the designed operating voltage. For a 12 V designed operating voltage, the low-side switch 24 can be less than 18 V and may be at least 14.4 V or at least 15.6 V.

Figure 4:
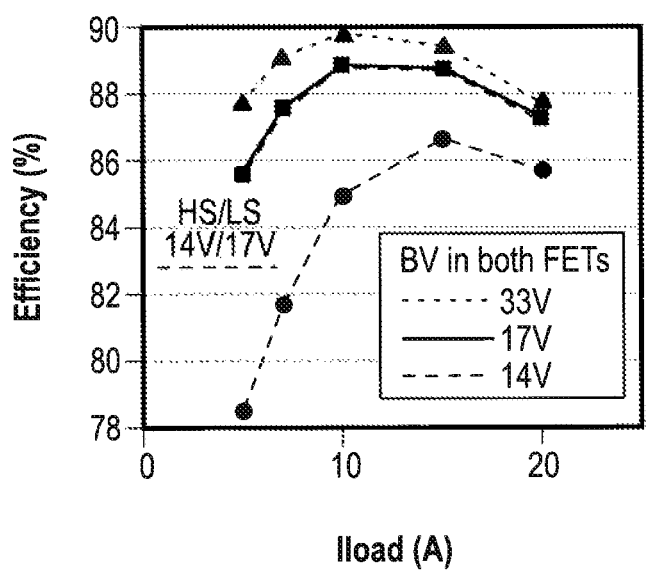
FIG. 4 includes a plot of efficiency as a function of load current for different breakdown voltages for the high-side and low-side switches.

The switches 22 and 24 can be designed with the same breakdown voltage or different breakdown voltages. FIG. 4 includes a graph illustrates efficiency as a function of load current ($I_{load}$) for different combinations of breakdown voltages for the switches 22 and 24 when the designed operating voltage is 12 V. If the switches 22 and 24 were to have a breakdown voltage of 33 V, the efficiency is the highest; however, the voltage overshoot and ringing are too high. When both switches 22 and 24 have a breakdown voltage of 17 V, the efficiency is relatively high, although not as high as 33 V breakdown voltages. The voltage overshoot and ringing will be significantly less than for the 33 V breakdown voltages. When both switches 22 and 24 have a breakdown voltage of 14 V, the efficiency is the lowest of the four combinations illustrated in FIG. 4 and will have the lowest voltage overshoot and least ringing of the four combinations. The relatively lower efficiency may be more due to the low-side switch 24 having the breakdown voltage of 14 V, as opposed to the high-side switch 22 having the breakdown voltage of 14 V. The switches 22 and 24 can have different breakdown voltages. For example, the high-side switch 22 can have a breakdown voltage of 14 V, and the low-side switch 24 can have a breakdown voltage of 17 V. The efficiency is nearly the same as when both switches have a breakdown voltage of 17 V. The voltage overshoot and ringing is less than when both switches are at 17 V. In other embodiments, other values for the breakdown voltage can be used. While different combinations of breakdown voltages have different efficiencies and different voltage overshoot and ringing characteristics, all combinations with breakdown voltages less than 2.0 times the designed operating voltage are within the scope of the concepts as described herein.

Figure 5:
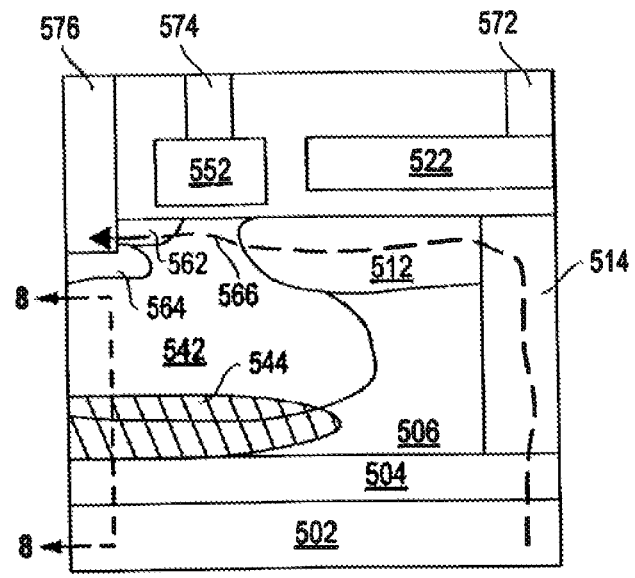
FIG. 5 includes an illustration of a cross-sectional view of a portion of an exemplary non-limiting structure for a high-side switch.
Figure 6:
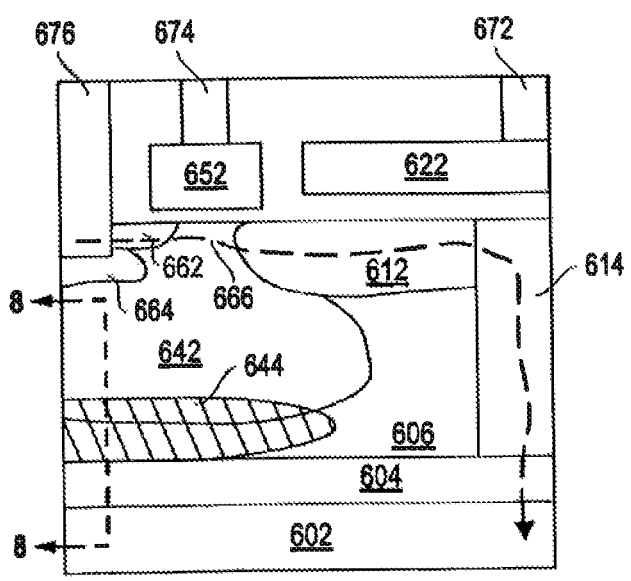
FIG. 6 includes an illustration of a cross-sectional view of a portion of an exemplary non-limiting structure for a low-side switch.

The lower breakdown voltages of the switches 22 and 24 can be achieved by increasing the dopant concentration within the structures of switches 22 and 24. In an embodiment, the breakdown can occur by introducing the zener diode 224 and 242 within the switches 22 and 24. FIGS. 5 and 6 include illustrations of cross-sectional views of the high-side switch 22 and the low-side switch 24 in accordance with an-exemplary, non-limiting embodiment. In this particular embodiment, the switches 22 and 24 can be implemented on different semiconductor dies. The switches 22 and 23 include buried doped regions 502 and 602 that may be doped regions of semiconductor substrate or can be the semiconductor substrates themselves. Doped semiconductor layers 504 and 604 are epitaxially grown from the buried doped regions 502 and 602 and have the same conductivity type as the buried doped regions 502 and 602. Lightly doped or undoped semiconductor layers 506 and 606 are epitaxially grown from the doped layers 504 and 604. When lightly doped, the semiconductor layers 506 and 606 can have a conductivity type that is the same or different from the doped semiconductor layers 504 and 604. Each of the dopant concentrations of the doped layers 504 and 604 are originally formed with a dopant concentration between (1) the dopant concentrations of the buried doped regions 502 and 602 and (2) the dopant concentrations of the semiconductor layers 506 and 606.

Portions of the semiconductor layers 506 and 606 are doped to form drift regions 512 and 612 of the drain regions of the MISFETs 222 and 242. Conductive regions 514 and 614 are formed and electrically connect the drift regions 512 and 612 to the buried doped regions 502 and 602. In the embodiment, an opening can be formed through the drift regions 512 and 612 and the semiconductor layers 506 and 606, and a conductive material is formed in the openings to form conductive structures as the conductive regions 514 and 614. In an alternative embodiment, one or more implants to form heavily doped regions as the conductive regions 514 and 614 that extend through the drift regions 512 and 612 and the semiconductor layers 506 and 606. Conductive electrodes 522 and 622 can be formed over portions of the drift regions 512 and 612 and the conductive regions 514 and 614. The conductive electrodes 522 and 622 may be referred to as shield electrodes and help to reduce gate-to-drain capacitance.

Doped regions 542 and 642 can be formed from portions of the semiconductor layers 506 and 606. Each of the doped regions can include a body region near the upper surface of the semiconductor layers 506 or 606 and a deep body region below the body region. The body regions and deep body regions can be formed as described in U.S. Pat. No. 8,389,369, which is incorporated herein by reference in its entirety.

In a particular embodiment, the zener diodes 224 and 244 can be formed at locations such that, during avalanche breakdown, current does not flow through the channel regions of the MISFETS 222 and 242. Referring to FIG. 5, the zener diode 224 can be in the form of an interface between a doped region 544 and an underlying layer of opposite conductivity type, such as the doped semiconductor layer 504. Referring to FIG. 6, the zener diode 244 can be in the form of an interface between a doped region 644 and an underlying layer of opposite conductivity type, such as the doped semiconductor layer 604. During avalanche breakdown of the zener diode 242, current flows through the doped region 542, the doped region 544, the doped semiconductor layer 504, and the doped buried region 502. During avalanche breakdown of the zener diode 244, current flows through the doped region 642, the doped region 644, the doped semiconductor layer 604, and the doped buried region 602.

Figure 7:
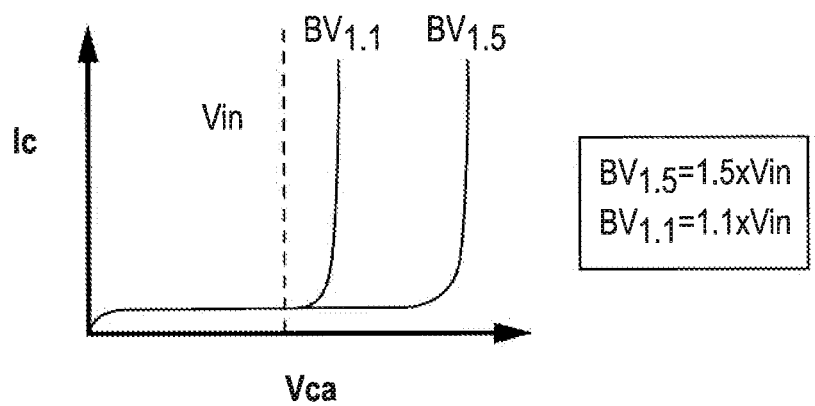
FIG. 7 includes a plot of cathode current as a function of reverse bias voltage for zener diodes having different dopant concentrations.

FIG. 7 includes a plot cathode current ($I_C$) versus voltage difference between the cathode and anode ($V_{CA}$) for two different zener diodes. One of the zener diodes is designed to have a breakdown voltage that 1.1 times the designed operating voltage, and the other is designed to have a breakdown voltage that 1.5 times the designed operating voltage. The doped regions 544 and 644 can be doped to a concentration to achieve a desired breakdown voltage.

Figure 8:
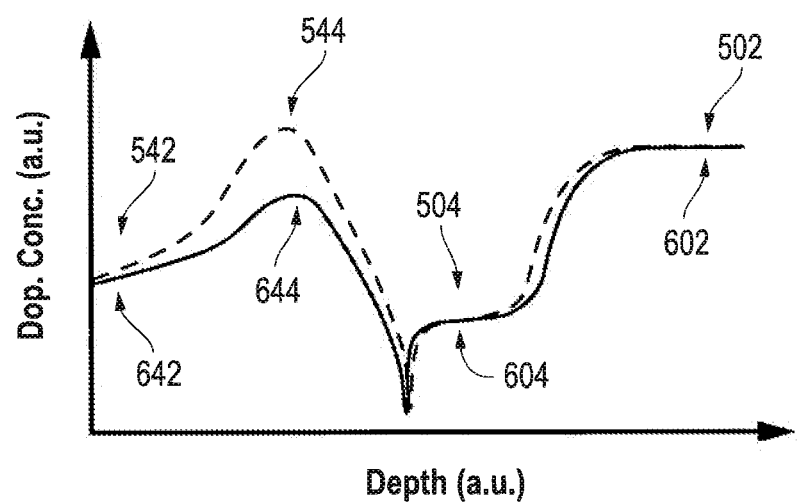
FIG. 8 includes an illustration of the dopant concentration as a function of depth for the structures as illustrated in FIGS. 5 and 6.

FIG. 8 includes an illustration of dopant concentrations as a function of depth for structures corresponding to the switches 22 and 24 in accordance with the particular, non-limiting embodiment as illustrated along sectioning line 8-8 in FIGS. 5 and 6. In FIG. 8, the structure of the high-side switch 22 is illustrated with the dashed line, and the structure of the low-side switch 24 is illustrated with the solid line. The left-hand side corresponds to a portion closer to the upper surface of the structure and can be p-type doped in particular embodiment, and the right-hand side corresponds to a portion closer to the buried doped regions 502 and 602 and can be n-type doped in such embodiment. The dopant concentrations for the doped regions 542 and 642, the doped semiconductor layers 504 and 604, and the buried doped regions 502 and 602 are substantially the same. The dopant concentration of the doped region 544 is higher than the dopant concentration of the doped region 644. Thus, the zener diode 224 will have a lower breakdown voltage as compared to the zener diode 244. The actual dopant concentration may depend on the particular physical structure, location of the doped regions 544 and 644, and dopant concentrations of adjacent regions or layers. The peak dopant concentrations for the doped regions 544 and 644 may be in a range of $2\times10^{16}$ atoms/cm$^3$ to $5\times10^{17}$ atoms/cm$^3$.

Processing can be continued to form a substantially completed device. Source regions 562 and 662 can be formed, and an interlevel dielectric layer can be formed over the substrate. The interlevel dielectric layer can be patterned to define openings that extend to the source regions 562 and 662. The etching can continue, potentially with a change in etch chemistry, to etch through the source regions 562 and 662, and body contact regions 564 and 664 are formed along the bottoms of the openings to allow ohmic contacts to be made. The interlevel dielectric layer can be patterned to define openings that extend to the conductive electrodes 522 and 622 and gate electrodes 552 and 652. The order in patterning the interlevel dielectric layer to form the openings is not critical. Conductive plugs 572, 574, and 576 can be formed within the openings in the interlevel dielectric layer. Further processing can be performed to form one or more interconnect layers, one or more additional interlevel dielectric layers, and a passivation layer, none of which are illustrated in FIGS. 5 and 6. U.S. Pat. No. 8,389,369 provides more details for forming the electronic device to the extent such details are not explicitly described herein.

In the finished device, the doped regions 544 and 644 are disposed under the body contact regions 564 and 664, the source regions 562 and 662, and portions of the drift regions 512 and 612. In the embodiment as illustrated, vertical lines would pass through the body contact regions 564 and 664 and the doped regions 544 and 654, other vertical lines would pass through the source regions 562 and 662 and the doped regions 544 and 654, and still other vertical lines would pass through portions of the drift regions 512 and 612 and the doped regions 544 and 644, wherein such vertical lines are perpendicular to upper surfaces of the semiconductor layers 506 and 606, as formed. In another embodiment, the doped regions 544 and 644 may not underlie the drift regions 512 and 612 and may not underlie the source regions 562 and 662.

During normal operation, when the MISFET 222 is on, current flows through the source region 562, the channel region 566, the drift region 512, the conductive region 514, the semiconductor layer 504, and the buried conductive region 502. When the MISFET 224 is on, current flows through the source region 662 the channel region 666, the drift region 612, the conductive region 614, the semiconductor layer 604, and the buried conductive region 602.

Furthermore, during normal operation, when the MISFET 222 is turned off and then the MISFET 242 is turned on, the reverse bias voltage across the zener diode 224 can exceed the avalanche breakdown voltage of the zener diode 224 during a portion of a transient period that corresponds to an overshoot or ringing at the switching node 232. During avalanche breakdown, current flows through the body contact region 564, the doped regions 542 and 544, the semiconductor layer 504, and the buried conductive region 502. After the overshoot or ringing no longer exceeds the avalanche breakdown voltage, no significant current flows through the zener diode 224 or the MISFET 222.

During normal operation, when the MISFET 242 is turned off and then the MISFET 222 is turned on, the reverse bias voltage across the zener diode 244 can exceeds the avalanche breakdown voltage of the zener diode 244 during a portion of a transient period that corresponds to an overshoot or ringing at the switching node 232. During avalanche breakdown, current flows through the body contact region 664, the doped regions 642 and 644, the semiconductor layer 604, and the buried conductive region 602. After the overshoot or ringing no longer exceeds the avalanche breakdown voltage, no significant current flows through the zener diode 244 or the MISFET 242.

Figure 9:
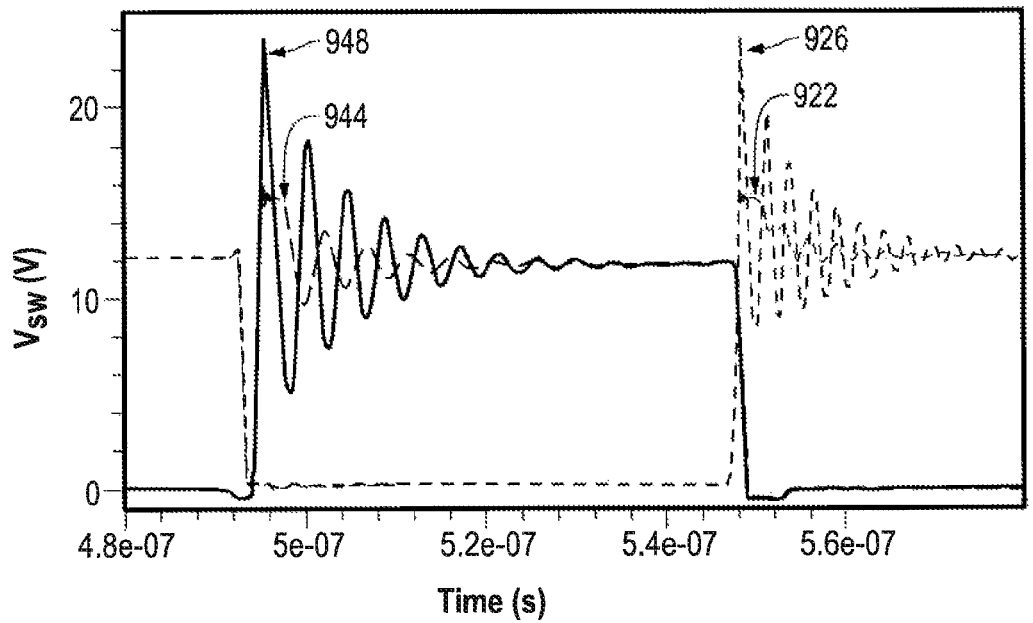
FIG. 9 includes an illustration of voltage at the switching node as a function of time for a circuit that includes switches in accordance with an embodiment described herein and a circuit with convention switches.

The electronic device allows for smaller and quicker recovery from overvoltage conditions that occur during normal operation when switching states of the switches 22 and 24. FIG. 9 includes a graph that simulates voltage at the switching node as a function of time. The first portion of the plot represents the leading edge, that is when the switching node transitions from 0 V to 12 V (low-side switch 24 in FIG. 2 is turned off, then the high-side switch 22 is turned off). The plot 944 simulates the voltage at the switching node when the zener diode 244 has an avalanche breakdown voltage of 14 V, and the plot 948 simulates the voltage at the switching node when a low-side switch has breakdown voltage of 24 V. The plot 922 simulates the voltage at the switching node when the zener diode 224 has an avalanche breakdown voltage of 14 V, and the plot 926 simulates the voltage at the switching node when a high-side switch has breakdown voltage of 24 V. As can be seen, voltage overshoot and ringing is significantly reduced. Thus, ringing will occur with a lower amplitude, and the duration of the transient period of the ringing will be shorter. The avalanche breakdown will occur with either of the switches 22 and 24 at least 50%, at least 90%, at least 95% or even 100% of the time when the states of both switches 22 and 24 are changed.

After reading this specification in its entirety, skilled artisans will appreciate that other embodiments can be implemented without deviating from the scope of the concepts as described herein. For example, the embodiment as illustrated in FIGS. 5 and 6 are well suited for embodiments in which no buried insulating layer is disposed between the doped buried region 502 and semiconductor layer 506 or between the doped buried region 602 and the semiconductor layer 606. In another embodiment, a buried insulating layer may be present or the high-side and low-side switches 22 and 24 can be integrated on the same die, such disclosed in U.S. Pat. No. 8,389,369. The doped regions that govern the zener diode breakdown voltages may be closer to the upper surfaces of the semiconductor layer 506 and 606, yet, are still spaced apart from the channel regions of the MISFETs 222 and 242. The body regions and deep body regions would be formed as described in U.S. Pat. No. 8,389,369; however, additional dopant may be implanted near the bottom of the body region to allow the breakdown to occur in a portion of the structure that is spaced apart form the channel region. See FIG. 25 of U.S. Pat. No. 8,389,369.

Figure 10:
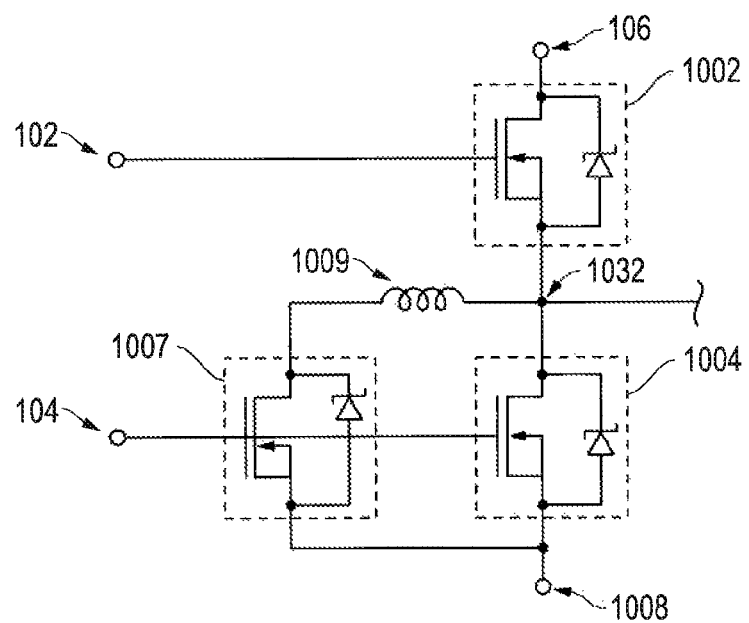
FIG. 10 includes a schematic diagram of a portion of an electronic device having switches in accordance with an alternative embodiment.

In another embodiment, one or more additional switches can be used. As illustrated in FIG. 10, the switches 1002 and 1004 are similar to switches 22 and 24, respectively. An inductor 1009 is coupled to the switching node 1032, and a switch 1007 is coupled to the inductor 1009 and to a terminal 1008. The terminal 1008 can be connected in a manner similar to terminal 108 in FIG. 1 or the terminal 208 in FIG. 2. The gate electrode of the MISFET within the switch 1002 can be electrically connected to the control terminal 102, and the gate electrodes of the MISFETs within the switches 1004 and 1007 can be electrically connected to the control terminal 104. Although not illustrated, the portion of the circuit to the right of the switching node 1032 may be the same as the portions of the circuit to the right of the switching node 232 as illustrated in FIG. 2. Each of the switches 1002, 1004, and 1007 include a MISFET and zener diode that are connected in parallel.

The zener diodes within switches 1002, 1004, and 1007 can have the same or different breakdown voltages. In a particular embodiment, the zener diodes in switches 1002 and 1004 may have a breakdown voltage that are approximately 1.2 times the designed operating voltage, and the zener diode within the switch 1007 may have a breakdown voltage that is approximately 1.4 times the designed operating voltage. For example, when the designed operating voltage is 12 V, the zener diodes within the switches 1002 and 1004 have breakdown voltages of 14 V, and the zener diode within the switch 1007 has a breakdown voltage of 17 V. During operation, both switches 1004 and 1007 will not go into avalanche breakdown at the same time.

In another embodiment, a switch and an inductor, similar to the switch 1007 and inductor 1009, can be connected in parallel to the high-side switch 1002 in place of or in addition to the switch 1007 and inductor 1009 that is connected in parallel with the low-side switch 1004.

Embodiments as described herein allow an electronic device with a switching circuit to have less overshoot and ringing at a switching node after changing the states of the switches. Referring to FIG. 2, when the low-side switch 24 is turned off and the high-side switch 22 is turned on, the leading edge of the voltage difference between the switching node 232 and terminal 208, which may be at ground in a particular embodiment, can exceed the breakdown voltage of the zener diode 244 within the low-side switch 24. Excess voltage is dissipated during avalanche breakdown of the zener diode 244. When the high-side switch 22 is turned off and the low-side switch 24 is turned on, the trailing edge of the voltage difference between the switching node 232 and the terminal 106, which may be at 12 V in a particular embodiment, can exceed the breakdown voltage of the zener diode 224 within the high-side switch 22. Excess voltage is dissipated during avalanche breakdown of the zener diode 224.

While embodiments described herein may not eliminate all overshoot or ringing at the switching node 232, the degree of overshoot, the amount and duration of ringing, or both at the switching node 232 is substantially less than a conventional device that is designed to have an avalanche breakdown of greater than 2.0 or even 2.5 times the designed operating voltage. The avalanche breakdown voltages can be less than 2.0 times the designed operating voltage, and may be even low such as no greater than 1.5 times the designed operating voltage or no greater than 1.3 times the designed operating voltage. The zener diodes can help to keep the voltage differences between the switching node and the terminals from getting too high within the switch during a transient period after a switch is turned off. Thus, the overshoot of voltage and ringing at the switching node 232 can be controlled by the design of the zener diodes associated with each of the switches. The designed operating voltage can be a voltage other than 12 V, for example 5 V, 30 V, 100 V, 500 V, or another voltage The zener diodes can be implemented within structures that are in close proximity to MISFETs. In accordance with a particular embodiment, during avalanche breakdown of a zener diode, electrons do not flow through the channel region of the associated MISFET. Therefore, degradation of the channel region (e.g., crystal defects), trapping excess charge within the gate dielectric, or other adverse affect to the MISFET can be substantially reduced or even eliminated. Implementation of the zener diodes can be made by introducing dopant at a proper concentration and depth to allow the zener diode to have the proper avalanche breakdown voltage and improve the likelihood that electrons during avalanche breakdown will generally flow in a desired direction.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Item 1. An electronic device can include a first switch having a first current-carrying electrode and a second current-carrying electrode. The first switch can have a first breakdown voltage between the first and second current-carrying electrodes. The first current-carrying electrode can be coupled to a first input terminal, and the second current-carrying electrode can be coupled to a switching node. The first switch can be part of an electronic circuit having a designed operating voltage between the first input terminal and a second input terminal, wherein the second input terminal is coupled to the second current-carrying electrode. The first breakdown voltage can be less than 2.0 times the designed operating voltage.

Item 2. The electronic device of Item 1, wherein the first breakdown voltage is less than 1.5 times the designed operating voltage.

Item 3. The electronic device of Item 2, further including a second switch having a first current-carrying electrode and a second current-carrying electrode. The second switch is part of the circuit, the first current-carrying electrode of the second switch is coupled to the second current-carrying electrode of the first switch at the switching node, and the second current-carrying electrode is coupled to the second input terminal.

Item 4. The electronic device of Item 3, wherein the second switch has a second breakdown voltage between the first and second current-carrying electrodes, and the second breakdown voltage is less than 2.0 times the designed operating voltage.

Item 5. The electronic device of Item 4, wherein the second breakdown voltage is less than 1.5 times the designed operating voltage.

Item 6. The electronic device of Item 4, further including an inductor coupled to the switching node.

Item 7. The electronic device of Item 4, wherein each of the first and second switches includes a field-effect transistor and a zener diode electrically connected in parallel.

Item 8. The electronic device of Item 7, further including a third field-effect transistor having a first current-carrying electrode and a second current-carrying electrode, and an inductor having a first terminal and a second terminal. The first current-carrying electrode of the third field-effect transistor is coupled to the first current-carrying electrode of the first field-effect transistor or the second current-carrying terminal of the second field-effect transistor. The second current-carrying electrode of the third field-effect transistor is coupled to the first terminal of the inductor, and the second terminal of the inductor is coupled to the switching node.

Item 9. An electronic device can include a first switch having a first current-carrying electrode and a second current-carrying electrode, wherein the first switch has a first breakdown voltage between the first and second current-carrying electrodes; and the first current-carrying electrode is coupled to a first input terminal. The electronic device can further include a second switch having a first current-carrying electrode and a second current-carrying electrode, wherein the second switch has a second breakdown voltage between the first and second current-carrying electrodes. The first current-carrying electrode of the second switch is coupled to the second current-carrying electrode of the first switch at a switching node, and the second current-carrying electrode is coupled to a second input terminal, wherein the first breakdown voltage is different from the second breakdown voltage.

Item 10. The electronic device of Item 9, wherein the first breakdown voltage is at least 1 volt less than the second breakdown voltage.

Item 11. The electronic device of Item 10, wherein the first and second switches are field-effect transistors.

Item 12. The electronic device of Item 8, wherein the first and second switches are within a same semiconductor substrate.

Item 13. A method of operating an electronic device can include providing a first switch, a second switch, a first input terminal, a second input terminal, and a switching node, wherein the first switch has a first current-carrying electrode and a second current-carrying electrode, wherein the first current-carrying electrode is coupled to the first input terminal. The method can further include providing a second switch having a first current-carrying electrode and a second current-carrying electrode, wherein the first current-carrying electrode of the second switch is coupled to the second current-carrying electrode of the first switch at the switching node, and the second current-carrying electrode of the second switch is coupled to the second input terminal. The method can further include placing the first input terminal at a first voltage, placing the second input terminal at a second voltage, and switching states of the first and second switches. During at least part of a transient period after switching states, the first switch or the second switch operates in avalanche mode.

Item 14. The method of Item 13, wherein:
the first switch includes a first field-effect transistor, the first current-carrying electrode is a drain region, and the second current carrying terminal is a source region;
the second switch includes a second field-effect transistor, the first current-carrying electrode is a drain region, and the second current carrying terminal is a source region;
the source region of the first field-effect transistor is electrically connected to the drain region of the second field-effect transistor, and
the first input terminal is at $V_{IN}$, and the second input terminal is at ground.

Item 15. The method of Item 14, wherein switching the states of the first and second switches includes turning off the first field-effect transistor, and during normal operation, the first field-effect transistor always operates in avalanche mode during the at least part of the transient period.

Item 16. The method of Item 15, wherein after the transient period and before further changing a state of the first field-effect transistor, substantially no current flows between the source and drain of the first field-effect transistor.

Item 17. The method of Item 15, wherein the electronic device further includes an inductor coupled to the switching node. The method further includes overshooting or ringing at the switching node during the transient period, wherein a voltage difference between the switching node and the first input terminal exceeds a breakdown voltage of a zener diode associated with the first field-effect transistor during the overshooting or ringing.

Item 18. The method of Item 14, wherein switching the states of the first and second switches includes turning off the second field-effect transistor, and during normal operation, the second field-effect transistor always operates in avalanche mode during the at least part of the transient period.

Item 19. The method of Item 18, wherein after the transient period and before further changing a state of the second field-effect transistor, substantially no current flows between the source and drain of the second field-effect transistor.

Item 20. The method of Item 18, wherein the electronic device further includes an inductor coupled to the switching node. The method further includes overshooting or ringing at the switching node during the transient period, wherein a voltage difference between the switching node and the second input terminal exceeds a breakdown voltage of a zener diode associated with the second field-effect transistor during the overshooting or ringing.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
a first switch having a first current-carrying electrode and a second current-carrying electrode, wherein:
the first switch has a first breakdown voltage between the first and second current-carrying electrodes;
the first current-carrying electrode is coupled to a first input terminal; and
the second current-carrying electrode is coupled to a switching node,
wherein:
the first switch is part of an electronic circuit having a designed operating voltage between the first input terminal and a second input terminal, wherein the second input terminal is coupled to the second current-carrying electrode; and
the first breakdown voltage is less than 2.0 times the designed operating voltage during at least part of a transient period after switching states, the first switch or the second switch operates in avalanche mode.

2. The electronic device of claim 1, wherein the first breakdown voltage is less than 1.5 times the designed operating voltage.

3. The electronic device of claim 2, further comprising:
a second switch having a first current-carrying electrode and a second current-carrying electrode, wherein:
the second switch is part of the circuit;
the first current-carrying electrode of the second switch is coupled to the second current-carrying electrode of the first switch at the switching node; and
the second current-carrying electrode is coupled to the second input terminal.

4. The electronic device of claim 3, wherein:
the second switch has a second breakdown voltage between the first and second current-carrying electrodes; and
the second breakdown voltage is less than 2.0 times the designed operating voltage.

5. The electronic device of claim 4, wherein the second breakdown voltage is less than 1.5 times the designed operating voltage.

6. The electronic device of claim 4, further comprising an inductor coupled to the switching node.

7. The electronic device of claim 4, wherein each of the first and second switches includes a field-effect transistor and a zener diode electrically connected in parallel.

8. The electronic device of claim 7, further comprising a third field-effect transistor having a first current-carrying electrode and a second current-carrying electrode, and an inductor having a first terminal and a second terminal, wherein:
the first current-carrying electrode of the third field-effect transistor is coupled to the first current-carrying electrode of the first field-effect transistor or the second current-carrying terminal of the second field-effect transistor;
the second current-carrying electrode of the third field-effect transistor is coupled to the first terminal of the inductor; and
the second terminal of the inductor is coupled to the switching node.

9. An electronic device comprising:
a first switch having a first current-carrying electrode and a second current-carrying electrode, wherein:
the first switch has a first breakdown voltage between the first and second current-carrying electrodes; and
the first current-carrying electrode is coupled to a first input terminal; and
a second switch having a first current-carrying electrode and a second current-carrying electrode, wherein:
the second switch has a second breakdown voltage between the first and second current-carrying electrodes;
the first current-carrying electrode of the second switch is coupled to the second current-carrying electrode of the first switch at a switching node; and
the second current-carrying electrode is coupled to a second input terminal,
wherein the first breakdown voltage is different from the second breakdown voltage during at least part of a transient period after switching states, the first switch or the second switch operates in avalanche mode.

10. The electronic device of claim 9, wherein the first breakdown voltage is at least 1 volt less than the second breakdown voltage.

11. The electronic device of claim 9, wherein the first switch includes a first zener diode and the second switch includes a second zener diode, wherein the first zener diode has a first dopant concentration and the second zener diode has a second dopant concentration, and wherein the first dopant concentration is different than the second dopant concentration.

12. The electronic device of claim 8, wherein the first and second switches are within a same semiconductor substrate.

13. A method of operating an electronic device comprising:
providing a first switch, a second switch, a first input terminal, a second input terminal, and a switching node, wherein:
the first switch has a first current-carrying electrode and a second current-carrying electrode, wherein the first current-carrying electrode is coupled to the first input terminal; and
a second switch having a first current-carrying electrode and a second current-carrying electrode, wherein:
the first current-carrying electrode of the second switch is coupled to the second current-carrying electrode of the first switch at the switching node; and
the second current-carrying electrode of the second switch is coupled to the second input terminal;
placing the first input terminal at a first voltage;
placing the second input terminal at a second voltage; and
switching states of the first and second switches,
wherein during at least part of a transient period after switching states, the first switch or the second switch operates in avalanche mode.

14. The method of claim 13, wherein:
the first switch includes a first field-effect transistor, the first current-carrying electrode is a drain region, and the second current carrying terminal is a source region;

the second switch includes a second field-effect transistor, the first current-carrying electrode is a drain region, and the second current carrying terminal is a source region;

the source region of the first field-effect transistor is electrically connected to the drain region of the second field-effect transistor, and the first input terminal is at $V_{IN}$, and the second input terminal is at ground.

15. The method of claim 14, wherein:

switching the states of the first and second switches comprises turning off the first field-effect transistor; and during normal operation, the first field-effect transistor always operates in avalanche mode during the at least part of the transient period.

16. The method of claim 15, wherein after the transient period and before further changing a state of the first field-effect transistor, substantially no current flows between the source and drain of the first field-effect transistor.

17. The method of claim 15, wherein:

the electronic device further comprises an inductor coupled to the switching node; and the method further comprises overshooting or ringing at the switching node during the transient period, wherein a voltage difference between the switching node and the first input terminal exceeds a breakdown voltage of a zener diode associated with the first field-effect transistor during the overshooting or ringing.

18. The method of claim 14, wherein:

switching the states of the first and second switches comprises turning off the second field-effect transistor; and during normal operation, the second field-effect transistor always operates in avalanche mode during the at least part of the transient period.

19. The method of claim 18, wherein after the transient period and before further changing a state of the second field-effect transistor, substantially no current flows between the source and drain of the second field-effect transistor.

20. The method of claim 18, wherein:

the electronic device further comprises an inductor coupled to the switching node; and the method further comprises overshooting or ringing at the switching node during the transient period, wherein a voltage difference between the switching node and the second input terminal exceeds a breakdown voltage of a zener diode associated with the second field-effect transistor during the overshooting or ringing.

* * * * *